US006563375B1

(12) United States Patent
Khosrowbeygi et al.

(10) Patent No.: US 6,563,375 B1
(45) Date of Patent: May 13, 2003

(54) AMPLIFIER HAVING STACKED CURRENT-DRIVEN CURRENT DRIVERS

(75) Inventors: Abolfazl Khosrowbeygi, Sunnyvale, CA (US); Sudhir Aggarwal, Santa Clara, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/688,778

(22) Filed: Oct. 16, 2000

(51) Int. Cl.$^7$ ................................................ H03B 1/00
(52) U.S. Cl. ....................... 327/563; 327/562; 327/540; 323/312; 323/314; 330/252; 330/261
(58) Field of Search ............................... 327/65, 66, 68, 327/561, 562, 563, 538, 540, 541, 543; 323/312, 314, 315, 316; 330/252, 261, 262, 263, 264, 267

(56) References Cited

U.S. PATENT DOCUMENTS

| | | | | |
|---|---|---|---|---|
| 4,480,337 A | * | 10/1984 | Graziadei et al. ........... | 455/333 |
| 4,560,947 A | * | 12/1985 | Frey ........................... | 330/254 |
| 4,663,594 A | * | 5/1987 | Perkins ....................... | 327/231 |
| 4,694,204 A | * | 9/1987 | Nishijima et al. ........... | 327/359 |
| 5,157,350 A | | 10/1992 | Rubens | |
| 5,831,454 A | * | 11/1998 | Keating ....................... | 326/126 |
| 5,912,583 A | * | 6/1999 | Pierson et al. .............. | 327/553 |
| 5,977,760 A | * | 11/1999 | Kimura ....................... | 323/316 |
| 5,994,961 A | * | 11/1999 | Lunn et al. .................. | 330/254 |
| 5,999,053 A | * | 12/1999 | Eschauzier .................. | 330/254 |
| 6,028,478 A | * | 2/2000 | Seremeta et al. ........... | 330/252 |

\* cited by examiner

Primary Examiner—Timothy P. Callahan
Assistant Examiner—An T. Luu
(74) Attorney, Agent, or Firm—Michael Schmitt

(57) ABSTRACT

According to a particular example application, the present invention is embodied in the form of first and second current-steering sections arranged to steer a differential current input signal. Each of the first and second current-steering sections is current driven via differential current paths. The first current-steering section configured and arranged to source current and thereby drive the second current-steering section. Another aspect of the invention employs stacked Gilbert cells, as described above, to form a variable gain amplifier ("VGA") circuit that achieves a large dynamic range, a wide frequency response and improved linearity, while consuming relatively low amounts of power.

16 Claims, 2 Drawing Sheets

AMPLIFIER HAVING STACKED CURRENT-DRIVEN CURRENT DRIVERS

FIELD OF THE INVENTION

The present invention relates generally to high-frequency amplifiers. More particularly, the present invention has found specific advantageous application in circuit amplification environments where circuits are sensitive to voltage excursions at input ports thereof. A particular example application of the present invention is directed to variable gain amplifier ("VGA") circuits where benefit is realized in achieving a large dynamic range, a wide frequency response and/or improved linearity, while consuming relatively low amounts of power.

BACKGROUND

The electronics industry continues to strive for high-powered, high-functioning circuits. Significant achievements in this regard have been realized through the fabrication of very large-scale integration of circuits on small areas of silicon wafer. For applications directed to high-frequency communications, main objectives in the design and manufacturing of such devices are typically directed to obtaining circuitry that occupies as small an area and uses the smallest amount of power as practicable, while at the same time preserving the integrity of the data being communicated by the signal.

One circuit often used in communications circuitry is commonly referred to as a variable gain amplifier ("VGA"). VGAs are used in numerous electronic products such as global positioning (GPS) receivers, wireless local area networks and mobile communication devices, such as cordless and cellular phones. In particular, VGAs are used in various parts of such devices, for example, in the radio frequency (RF), intermediate frequency (IF) and the low frequency, and/or in connection with base-band signal processing for these devices.

A typical VGA includes a differential pair of transistors, which steers a portion of an input current signal to an output terminal, while the other unused portion of the input current signal is directed to ground. The amount of signal current that is steered to the output terminal depends on the differential control voltage that is applied to the respective bases of the differential pair of transistors. In general, applying a higher control voltage to the base of one of the transistors, as compared to the base of the other transistor, will determine the extent to which the input signal current is available at the output terminal. The formula for the gain control characteristic of such a VGA circuit is determined as a function of translinear equations defined by the particular arrangement of the circuitry. For details of this analysis, reference may be made to various sources including, for example, the text by B. Gilbert, entitled *Current-Mode Circuits from a Translinear Viewpoint: a Tutorial*, at Chapter 2 (United Kingdom 1990) and U.S. Pat. Nos. 5,999,053, 6,028,478 and 5,994,961.

In attempting to design a VGA for a particular application, consideration is typically given to several known limitations of typical VGA circuit arrangements. Using wireless communications as an example category of applications, these limitations are often directed to controlling the signal level at the input or output of a functional block. Controlling this signal level is often realized by changing the gain or attenuation in a circuit via a control voltage. In VGA circuits, however, such control voltage adjustments can result in serious operational shortcomings including, for example, limitations in the dynamic range and significant increases in power consumption. Variations of signal level with control voltage adjustments can also result in the degradation of key operational aspects used in characterizing a VGA; namely, noise and nonlinearity performance.

Accordingly, there is a need to provide a variable gain amplifier having an expanded dynamic range, a wide frequency response and/or improved linearity, while consuming relatively low amounts of power.

SUMMARY

The present invention is implemented in various embodiments directed to addressing the above applications and concerns, as well as other advantages that will become apparent upon a careful review of the following discussion. For example, certain aspects of the invention are directed to advantages discovered in connection with stacking current-steering circuits in combination with eliminating voltage excursions from a signal presented to the stacked current-steering circuits. Appropriately implemented, this approach can result in a number advantages relating to improvements in terms of dynamic range, linearity and power consumption.

According to a particular example application, the present invention is embodied in the form of first and second current-steering sections arranged to gain-adjust (or "amplify," including both positive and negative gain-adjustments) a differential current input signal. Each of the first and second current-steering sections is current driven via differential current paths. The first current-steering section configured and arranged to source current and thereby drive the second current-steering section.

Another aspect of the invention employs stacked Gilbert cells, as referred to in connection with the above background discussion, to form a variable gain amplifier ("VGA") circuit that achieves a large dynamic range, a wide frequency response and improved linearity, while consuming relatively low amounts of power. In this context a Gilbert cell is a form of a transistor-based amplifier in which current at an input port is divided (or separated), according the transistor-based amplifier design, into at least two outputs.

In yet another specific example embodiment of the present invention, an amplification arrangement includes a voltage to current converter for current feeding the above-characterized VGA circuit.

The above summary is not intended to provide an overview of all aspects of the present invention. Other aspects of the present invention are exemplified and described in connection with the detailed description.

BRIEF DESCRIPTION OF THE DRAWINGS

The invention may be more completely understood in consideration of the detailed description of various embodiments of the invention which follows in connection with the accompanying drawings, in which.

Figure 1:
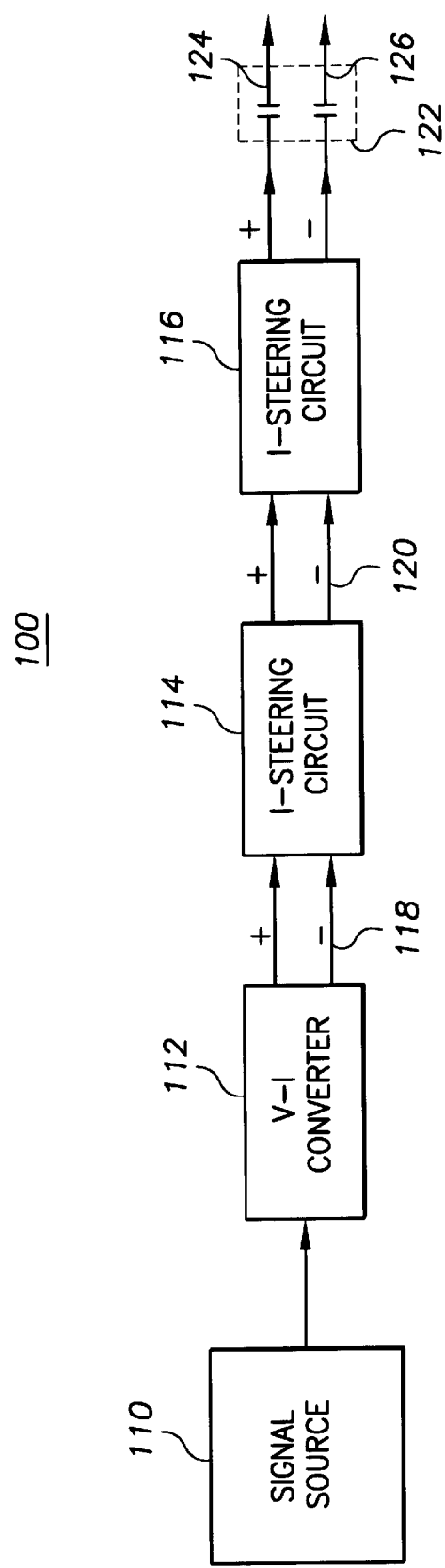
FIG. 1 illustrates a block diagram of an amplifier circuit arrangement, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DISCLOSED EMBODIMENTS

The present invention is believed to be applicable to a variety of high-frequency signal amplification circuits and applications. The invention has been found to be particularly beneficial for high-frequency signal circuit amplification environments where a control voltage excursion at the input port of the amplifier can result in operational shortcomings including, for example, limitations in the dynamic range and/or unwarranted increases in power consumption. While the present invention is not necessarily limited to such circuits or applications, various aspects of the present invention are best appreciated by a discussion of example embodiments operating in such environments.

According to a first example embodiment, a current-steering amplifier circuit includes first and second stacked current-steering circuit sections. Each of these circuit sections is configured and arranged to amplify a differential current input signal. The first current-steering section is responsive to a controlled differential current source feeding input ports of the first section. The amplified output of the first current-steering section is used to drive, and thereby act as a current source for the second current-steering section. By controlling the magnitude of the current fed to the first currentsteering section, voltage excursions are unnecessary to control the operation of the current-steering amplifier circuit and its susceptibility to the above-mentioned problems is mitigated. Consequently, increased dynamic range and improved linearity are realized without an unwarranted increase in power consumption.

Turning now to the drawings, FIG. 1 illustrates a block diagram of an amplifier circuit arrangement 100, according to an example embodiment of the present invention. The amplifier circuit arrangement 100 includes a signal source circuit 110 which, although not critical to the invention, can be an important application-specific aspect of the design. For example, in various implementations, the signal source circuit 110 is a block in the radio frequency (RF), intermediate frequency (IF) and the low frequency stages of a modulated signal. In another example implementation, the signal source circuit 110 is a block in the base-band signal processing stage of a wireless transceiver. As is conventional with many of the above-mentioned example applications, the signal source circuit 110 is adapted to present a high-frequency voltage-controlled signal to the next stage of the amplifier circuit arrangement 100.

This high-frequency voltage-controlled signal is then received by a voltage-to-current converter 112 which converts the information carried by the voltage excursions in the signal to a differential current signal, via current paths 118. A significant advantage, discovered in connection with the present invention, is that elimination of voltage excursions from a signal presented to a pair of stacked current-steering circuits can result in a number advantages including the above-mentioned advantages relating to dynamic range, linearity and power consumption.

Accordingly, the current paths 118 present the differential current signal to the first of two stacked current-steering circuits 114 and 116. Each of the current-steering circuits 114 and 116 is implemented to split the current received at an input port into two outputs. In this regard, the first current-steering circuit 114 receives and amplifies the differential current-defined signal carried by current paths 118 and presents this signal to the second current-steering circuit 116 as a differential current-defined signal on differential current paths 120. The second current-steering circuit 116 is then used to complete a second stage of amplification. Optional additional stacked current-steering circuits (not shown) may then be used for further stages of amplification. Also shown in FIG. 1 is an optional voltage shifting circuit 122 implemented as a conventional high-pass filter using in-line capacitors 124 and 126.

Figure 2:
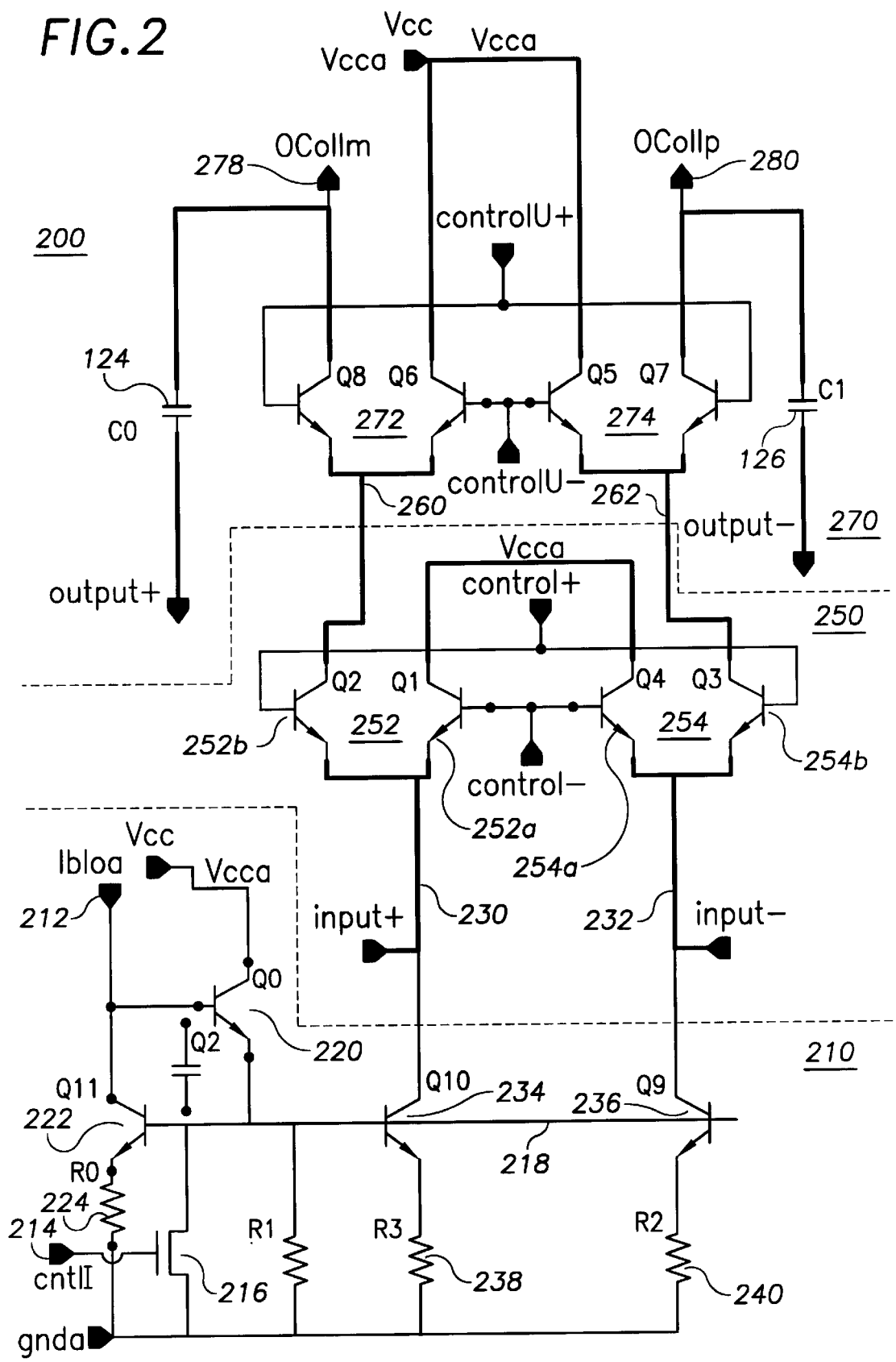
FIG. 2 illustrates a specific implementation of an amplifier circuit arrangement, also in accordance with the present invention.

FIG. 2 illustrates an example attenuation circuit 200 relating to blocks 112, 114 and 116 of FIG. 1 for a particular example application, according to the present invention. The attenuation circuit 200 includes a current-source circuit 210 that is responsive to an input bias signal presented to input port 212 and, optionally, to a control signal presented to control port 214. From the input port 212, the input bias signal is used to drive the base of transistor 220 using a base voltage set by the transistor 222 and its emitter-trailing resistor 224. The transistor 220 responds by sourcing current at node 218 which is then converted into balanced, differential current paths at nodes 230 and 232, using transistors 234 and 236. Nodes 230 and 232 correspond respectively to opposing (positive and negative) inputs of a differential, current-driven signal such as provided by block 112 of FIG. 1. In one implementation, the mirrored transistors 222, 234 and 236 (as well as resistors 238 and 240) are matched to effect optimum balance in the differential, current-driven signal.

The optional control signal presented to control port 214 can be used for different purposes. In one application, the optional control signal is useful to disable further processing of the input bias signal by using MOS transistor 216 as a switch and effectively bringing the voltage at node 218 to ground and therein also mitigating leakage current in the disabled mode. Alternatively, or in combination with this switching operation, the MOS transistor 216 is used to adjust the voltage at node 218 for biasing purposes.

From the nodes 230 and 232, the differential, current-driven signal is presented to a first balanced current-steering circuit section 250. The current-steering circuit section 250 includes two sets 252 and 254 of matched current-splitting transistors. The transistor sets 252 and 254 include transistors 252a and 254a sharing a first (e.g., negative) common bias at their respective bases, and transistors 252b and 254b sharing another, opposing (or positive) common bias at their respective bases. These biases are used as is conventional in VGA current-steering circuits to adjust the operation of the amplifier circuit. The respective collectors of transistors 252b and 254b are used to define current-feed nodes 260 and 262 for the second balanced current-steering circuit section 270.

The second balanced current-steering circuit section 270 is implemented further to attenuate the attenuated differential, current-driven signal presented at nodes 260 and 262, in a manner similar to the implementation and operation shown in connection with the first balanced current-steering circuit section 250. Accordingly, the differential, current-driven signal is presented to tied emitters of each of two sets 272 and 274 of matched current-splitting transistors. Each of the transistor sets 272 and 274 have common biases at their respective bases as described and illustrated in connection with the first balanced current-steering circuit section 250. These transistor-base biases are also used, in conjunction with the transistor-base biases of the first balanced current-steering circuit section 250, to make any helpful adjustments to the attenuation circuit 200.

In one specific example VGA application, one or more of the above embodiments have been implemented to realize a linear dynamic range extending from −70 dB to over 0 dB in response to about a 2.3 volt control voltage variation without the typical unacceptable increases in power consumption. These are significant improvements over the operation of conventional VGA circuits.

Accordingly, the present invention is directed to a current-steering circuit arrangement and signal processing approach for realizing significant advantages in terms of dynamic range, linearity and power consumption. The various embodiments described above are provided by way of illustration only and are not intended to limit the invention. Those skilled in the art will readily recognize various modifications and changes that may be made to the present invention without strictly following the example embodiments and applications illustrated and described herein. For example, the specific current-steering circuits shown in connection with FIG. 2 can be varied in a number of ways including, for example, to conform with various aspects of the current steering arrangements of the above-mentioned background sources, incorporated herein by reference, and various other forms of Gilbert cells. The scope of the present invention is set forth in the following claims.

What is claimed is:

1. A current steering circuit, comprising:
   first and second current sections configured and arranged to amplify a differential current input signal; and
   a differential current path responsive to the differential current input signal and having balanced first and second current signal paths respectively traversing the first and second current sections, the first and second current sections configured and arranged such that, in operation, the first current section drives the second current section, main current signal paths of the first and second current sections being stacked and forming the balanced first and second current signal paths, and the second current section being configured and arranged to provide a differential signal output of the current steering circuit;
   wherein the first current section comprises first, second, third, and fourth transistors, the emitters of the first and second transistors coupled in common, the emitters of the third and fourth transistors coupled in common, the bases of the first and fourth transistors coupled in common, the bases of the second and third transistors coupled in common, the collectors of the second and third transistors coupled in common, and the collectors of the first and fourth transistors forming a first pair of differential current output terminals.

2. The current steering circuit of claim 1, wherein the collectors of the second and fourth transistors are coupled to a power supply node.

3. The current steering circuit of claim 2, wherein the second current section comprises fifth, sixth, seventh, and eighth transistors, the emitters of the fifth and sixth transistors coupled in common, the emitters of the seventh and eighth transistors coupled in common, the bases of the fifth and eighth transistors coupled in common, the bases of the sixth and seventh transistors coupled in common, the collectors of the sixth and seventh transistors coupled in common, and the collectors of the fifth and eighth transistors forming a second pair of differential current output terminals.

4. The current steering circuit of claim 3, wherein the collectors of the sixth and seventh transistors are coupled to the power supply node.

5. The current steering circuit of claim 3, wherein the emitters of the first and second transistors are coupled to a first current source and the emitters of the third and fourth transistors are coupled to a second current source.

6. The current steering circuit of claim 5, wherein the first current and second current sources each comprise a transistor and each transistor having a control terminal coupled in common to a bias node, the bias node having a voltage that is a dependent upon the operation of at least two transistors.

7. A current steering circuit, according to claim 1, wherein the first and second current section are configured and arranged as a variable gain amplifier having a dynamic range at VHF frequencies.

8. A current steering circuit, comprising:
   stacked first and second Gilbert cell-circuit sections, each section configured and arranged to amplify a differential current input signal, a differential current source path configured to drive the first Gilbert cell-circuit section and the first Gilbert cell-circuit section configured to drive the second Gilbert cell-circuit section, and the second Gilbert cell-circuit section being configured and arranged to provide a differential signal output of the current steering circuit;
   wherein the first Gilbert cell-circuit section comprises first, second, third, and fourth transistors, the emitters of the first and second transistors coupled in common, the emitters of the third and fourth transistors coupled in common, the bases of the first and fourth transistors coupled in common, the bases of the second and third transistors coupled in common, the collectors of the second and third transistors coupled in common, and the collectors of the first and fourth transistors forming a first pair of differential current output terminals.

9. A current steering variable gain amplifier arrangement, comprising:
   first and second current-steering sections configured and arranged to amplify a differential current input signal, each of the first and second current-steering sections being current driven via differential current paths, the first current-steering section configured and arranged to source current and thereby drive the second current-steering section, main current signal paths of the first and second current steering section being stacked and the second current-steering section being configured and arranged to provide a differential output signal;
   wherein the first current-steering section comprises first, second, third, and fourth transistors, the emitters of the first and second transistors coupled in common, the emitters of the third and fourth transistors coupled in common, the bases of the first and fourth transistors coupled in common, the bases of the second and third transistors coupled in common, the collectors of the second and third transistors coupled in common, and the collectors of the first and fourth transistors forming a first pair of differential current output terminals.

10. A current steering variable gain amplifier arrangement, according to claim 9, wherein each of the first and second current-steering sections share a respective common transistor bias.

11. A current steering variable gain amplifier arrangement, according to claim 9, further including a voltage to current converter configured and arranged to present the differential current input signal to the first current-steering section.

12. A current steering variable gain amplifier arrangement, according to claim 11, wherein the first and second current-steering sections are further configured and arranged to provide a linear dynamic range at VHF frequencies.

13. A wireless device comprising a current steering variable gain amplifier, the current steering variable gain amplifier comprising:

first and second current-steering sections configured and arranged to amplify a differential current input signal, each of the first and second current-steering sections being current driven via differential current paths, the first section configured and arranged to source current and thereby drive the second current-steering section, main current signal paths of the first and second current steering section being stacked and the second current-steering section being configured and arranged to provide a differential output signal;

wherein the first current-steering section comprises first, second, third, and fourth transistors, the emitters of the first and second transistors coupled in common, the emitters of the third and fourth transistors coupled in common, the bases of the first and fourth transistors coupled in common, the bases of the second and third transistors coupled in common, the collectors of the second and third transistors coupled in common, and the collectors of the first and fourth transistors forming a first pair of differential current output terminals.

14. An amplifier, comprising:

an input circuit configured and arranged to convert a voltage input signal to a differential current input signal;

a first current-steering circuit being configured and arranged to process the differential current input signal and in response to the differential current input signal to provide a first differential current output signal;

a second current-steering circuit being configured and arranged to process the first differential current output signal and in response to the first differential current output signal to provide a second differential current output signal as an output signal of the amplifier, main current paths of the first and second current-steering circuits being stacked;

wherein the first current-steering circuit comprises first, second, third, and fourth transistors, the emitters of the first and second transistors coupled in common, the emitters of the third and fourth transistors coupled in common, the bases of the first and fourth transistors coupled in common, the bases of the second and third transistors coupled in common, the collectors of the second and third transistors coupled in common, and the collectors of the first and fourth transistors forming a first pair of differential current output terminals.

15. The amplifier of claim 14, wherein the second current-steering circuit comprises fifth, sixth, seventh, and eighth transistors, the emitters of the fifth and sixth transistors coupled in common, the emitters of the seventh and eighth transistors coupled in common, the bases of the fifth and eighth transistors coupled in common, the bases of the sixth and seventh transistors coupled in common, the collectors of the sixth and seventh transistors coupled in common, and the collectors of the fifth and eighth transistors forming a second pair of differential current output terminals.

16. The amplifier of claim 15, wherein the emitters of the first and second transistors are coupled to a first current source and the emitters of the third and fourth transistors are coupled to a second current source.

* * * * *